United States Patent
Lin et al.

(10) Patent No.: US 9,336,709 B2
(45) Date of Patent: May 10, 2016

(54) DISPLAYS WITH OVERLAPPING LIGHT-EMITTING DIODES AND GATE DRIVERS

(71) Applicant: Apple Inc., Cupertino, CA (US)

(72) Inventors: Chin-Wei Lin, Cupertino, CA (US); Shih-Chang Chang, Cupertino, CA (US); Tsung-Ting Tsai, Taipei (TW)

(73) Assignee: Apple Inc., Cupertino, CA (US)

( * ) Notice: Subject to any disclaimer, the term of this patent is extended or adjusted under 35 U.S.C. 154(b) by 49 days.

(21) Appl. No.: 14/262,363

(22) Filed: Apr. 25, 2014

(65) Prior Publication Data

US 2015/0310801 A1 Oct. 29, 2015

(51) Int. Cl.
*G09G 3/32* (2006.01)
*H01L 27/32* (2006.01)

(52) U.S. Cl.
CPC .......... *G09G 3/3225* (2013.01); *H01L 27/3248* (2013.01); *H01L 27/3276* (2013.01); *G09G 2310/0264* (2013.01); *H01L 27/326* (2013.01); *H01L 27/3262* (2013.01); *H01L 2251/5315* (2013.01)

(58) Field of Classification Search
CPC . G09G 3/3208; G09G 3/3225; G09G 3/3266; G09G 2300/0408; G09G 2310/0264; G09G 2310/0281; H01L 27/326; H01L 27/3248; H01L 27/3262; H01L 27/3276; H01L 2251/5315
USPC .................. 345/204–215, 690–699
See application file for complete search history.

(56) References Cited

U.S. PATENT DOCUMENTS

| | | | |
|---|---|---|---|
| 7,435,629 B2 | 10/2008 | Youn | |
| 8,248,440 B2 | 8/2012 | Ben-David et al. | |
| 8,373,836 B2 | 2/2013 | Tsai et al. | |
| 8,467,133 B2 | 6/2013 | Miller | |
| 8,598,583 B2 | 12/2013 | Ryu et al. | |
| 2003/0030381 A1 | 2/2003 | Yamazaki et al. | |
| 2003/0082859 A1* | 5/2003 | Ichijo | H01L 21/0237 438/166 |
| 2006/0028126 A1* | 2/2006 | Lifka | H01L 27/3288 313/505 |
| 2010/0053044 A1* | 3/2010 | Lee | H01L 51/5259 345/80 |
| 2010/0079419 A1* | 4/2010 | Shibusawa | H01L 27/3272 345/204 |
| 2011/0248968 A1 | 10/2011 | Shu | |
| 2012/0146886 A1 | 6/2012 | Minami et al. | |
| 2013/0334543 A1 | 12/2013 | Kim et al. | |
| 2014/0184479 A1* | 7/2014 | Wu | G06F 1/1601 345/80 |

OTHER PUBLICATIONS

PCT Report for PCT US2015/027375 dated Jul. 27, 2015.

* cited by examiner

*Primary Examiner* — Larry Sternbane
(74) *Attorney, Agent, or Firm* — Treyz Law Group, P.C.; G. Victor Treyz; Zachary D. Hadd

(57) ABSTRACT

An electronic device may be provided with a display. The display may be formed from an array of organic light-emitting diode display pixels. Each display pixel may have an organic light-emitting diode having an anode and a cathode and may have an associated pixel circuit for controlling the light-emitting diode. The anodes may be formed from patches of metal arranged in an array on the display. The display pixels may be controlled using data lines and gate lines. The gate lines may control thin-film transistors in the pixel circuits. Gate driver circuitry along the left and right edges of the display may supply signals to the gate lines. The pixel circuits may be located in the center of the display between the gate driver circuitry. Some of the anodes may overlap the pixecir-cuits and some of the anodes may overlap the gate driver circuitry.

19 Claims, 8 Drawing Sheets 1

DISPLAYS WITH OVERLAPPING LIGHT-EMITTING DIODES AND GATE DRIVERS

BACKGROUND

This relates generally to electronic devices and, more particularly, to electronic devices with displays that have thin-film transistor circuits and light-emitting diodes.

Electronic devices often include displays. For example, cellular telephones and portable computers include displays for presenting information to users.

Displays such as organic light-emitting diode displays have arrays of display pixels based on light-emitting diodes. In this type of display, each display pixel includes a light-emitting diode and thin-film transistors for controlling application of a signal to the light-emitting diode. The array of display pixels is used to present images to a user. Gate driver circuitry is located around the periphery of the display. The presence of the gate driver circuitry along the edges of the display can create undesirable inactive border regions in which no image light is emitted.

It would therefore be desirable to be able to provide improved electronic device displays such as displays with minimized border regions.

SUMMARY

An electronic device may be provided with a display. The display may be formed from an array of organic light-emitting diode display pixels. Each display pixel may have an organic light-emitting diode having an anode and a cathode. An associated pixel circuit in each display pixel may be used to control the light-emitting diode of that display pixel.

The anodes may be formed from patches of metal arranged in an array on the display. A shared cathode may overlap the anodes. Patterned emissive layer material may be interposed between the anode and cathode of each light-emitting diode. When current flows between the anode and cathode of a light-emitting diode, light is produced for the display pixel contain the light-emitting diode.

The display pixels may be controlled using data lines and gate lines (scan lines). The gate lines may control thin-film transistors in the pixel circuits of the display pixels. Gate driver circuitry along the left and right edges of the display may supply signals to the gate lines. The gate driver circuitry may include a chain of shift register circuits and buffers that drive gate line signals from the shift register circuits onto corresponding gate lines.

The pixel circuits may be located in the center of the display and may be flanked on either side by gate driver circuitry running along opposing edges of the display. Some of the anodes in the display may overlap the pixel circuits in the center of the display and some of the anodes may overlap the gate driver circuitry. The use of anodes that overlap the gate driver circuitry allows display pixel structures near the edge of the display to emit light for forming display images, thereby reducing or eliminating inactive border regions in the display.

DETAILED DESCRIPTION

Figure 1:
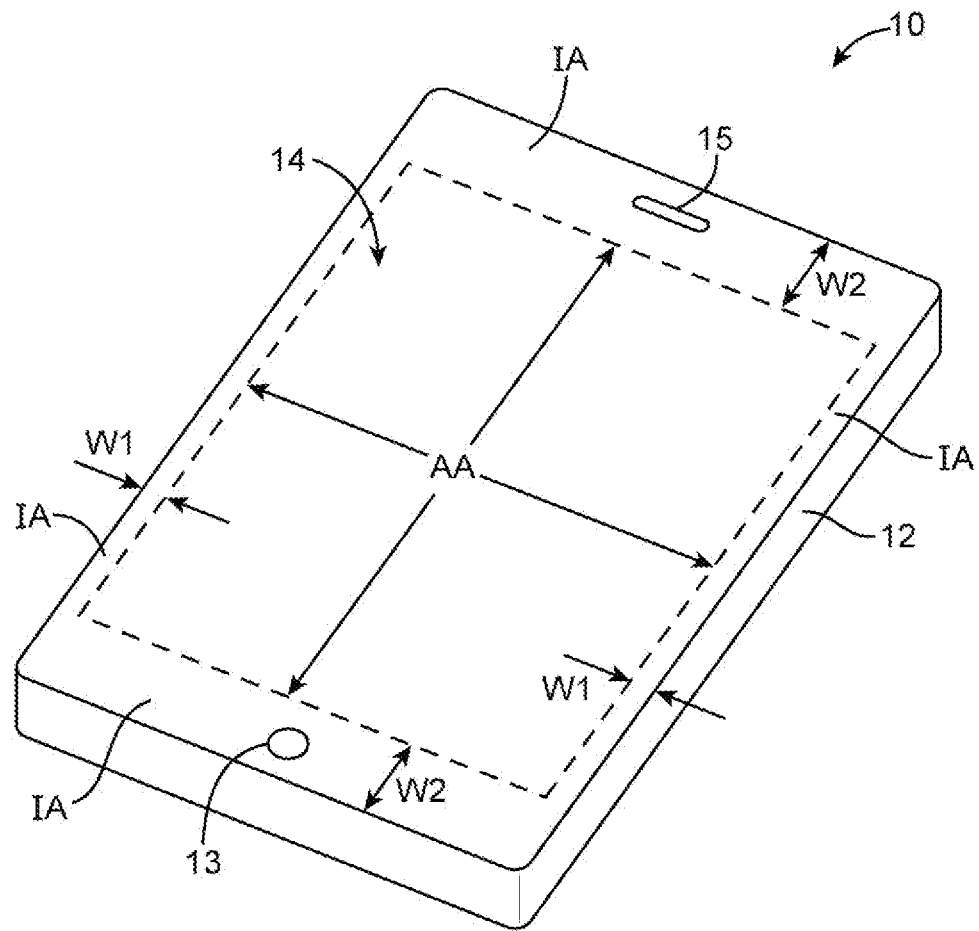
FIG. 1 is a perspective view of an illustrative electronic device in accordance with an embodiment.

Electronic devices may be provided with displays having minimized inactive border regions. FIG. 1 is a perspective view of an illustrative electronic device of the type that may have a display with a minimized border. An electronic device such as electronic device 10 of FIG. 1 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

In the example of FIG. 1, device 10 includes a display such as display 14. Display 14 has been mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from an array of organic light-emitting diode display pixels or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 13. An opening may also be formed in the display cover layer to accommodate ports such as speaker port 15.

Display 14 may contain an array of display pixels that display images for a user. The region of display 14 that contains the display pixels and that displays the images is sometimes referred to as the active area of the display. Active area AA of display 14 may be surrounded by a region such as inactive area IA that is free of display pixels and that does not emit light for displaying images. As shown in FIG. 1, active area AA may have a rectangular shape. At the upper and lower ends of device 10 of FIG. 1, inactive area IA may each have a dimension W2 that is sufficient to accommodate openings for speaker 15 and button 13 or other components. One the opposing left and right edges of display 14 and device 10, inactive area IA has a border width of W1. To improve device aesthetics and provide maximized area for displaying images for a user in a compact device, it may be desirable to minimize the magnitude of W1 (i.e., to make W1 equal to zero or to otherwise reduce the size of W1). This may be done by stacking display pixel structures such as display pixel anodes over display driver circuitry such as gate driver circuits running along the opposing left and right edges of display 14.

Figure 2:
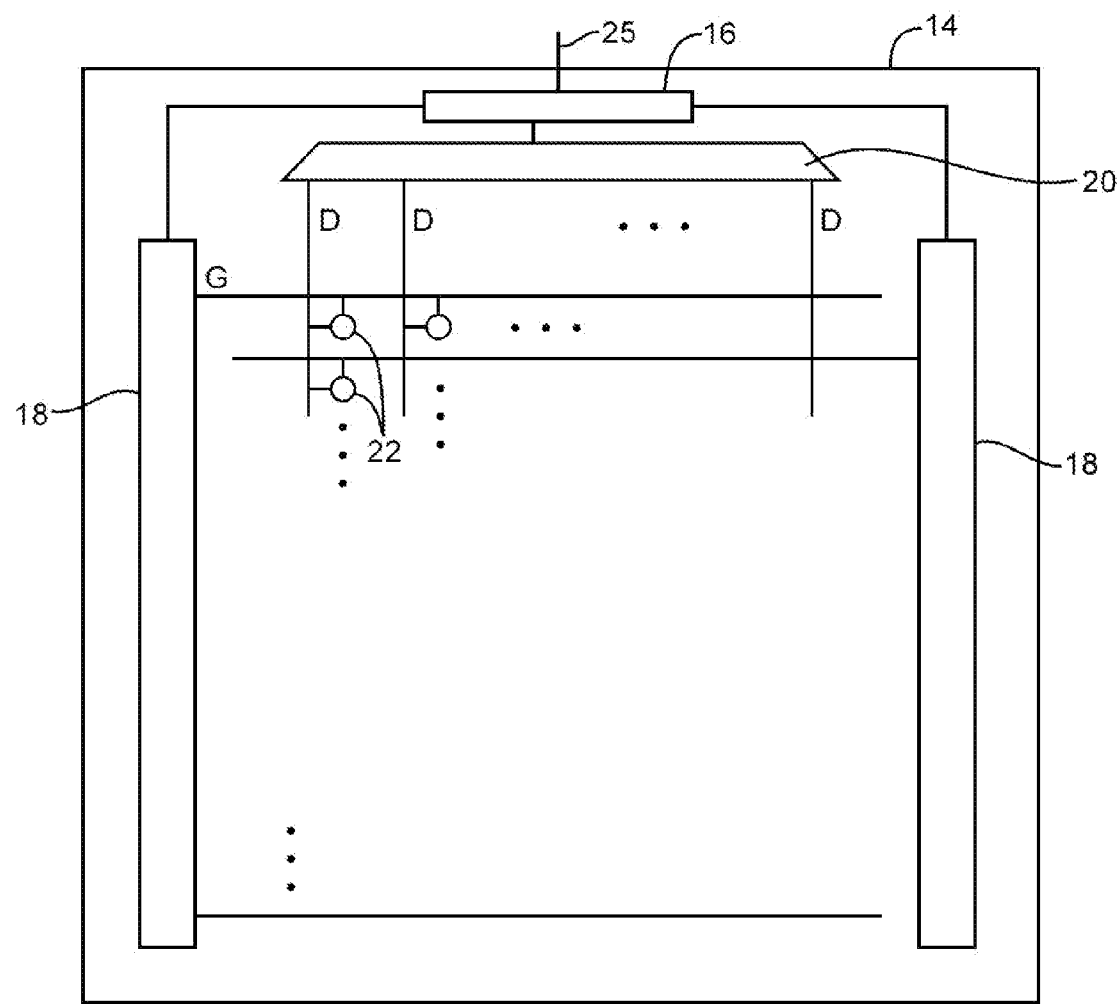
FIG. 2 is a diagram of an illustrative display such as an organic light-emitting diode display having an array of organic light-emitting diode display pixels in accordance with an embodiment.

A circuit diagram of an illustrative display that may be configured to have minimized inactive borders is shown in FIG. 2. Display 14 may be formed from layers of material that have been deposited and patterned on a substrate. The substrate may be a rectangular layer such as a layer of glass, plastic, metal, or other materials.

Display 14 may have an array of display pixels 22 for displaying images for a user. The array of display pixels 22 may be formed from rows and columns of display pixel structures. There may be any suitable number of rows and columns in the array of display pixels 22 (e.g., ten or more, one hundred or more, or one thousand or more).

Display driver circuitry such as display driver integrated circuit 16 may be coupled to conductive paths such as metal traces on the display substrate using solder or conductive adhesive. Display driver integrated circuit 16 (sometimes referred to as a timing controller chip) may contain communications circuitry for communicating with system control circuitry over path 25. Path 25 may be formed from traces on a flexible printed circuit or other cable. The control circuitry may be located on a main logic board in an electronic device such as a cellular telephone, computer, set-top box, media player, portable electronic device, or other electronic equipment in which display 14 is being used. During operation, the control circuitry may supply display driver integrated circuit 16 with information on images to be displayed on display 14. To display the images on display pixels 22, display driver integrated circuit 16 may supply corresponding image data to data lines D while issuing clock signals and other control signals to supporting thin-film transistor display driver circuitry such as gate driver circuitry 18 and demultiplexing circuitry 20.

Display driver circuitry such as demultiplexer circuitry 20 and gate line driver circuitry 18 may be formed from thin-film transistors on the display substrate. Thin-film transistors may also be used in forming pixel circuits in display pixels 22. The thin-film transistor circuitry in display 14 may, in general, be formed using any suitable type of thin-film transistors (e.g., silicon-based transistors such as low-temperature polysilicon thin-film transistors, semiconducting-oxide-based transistors such as amorphous indium gallium zinc oxide thin-film transistors, etc.).

Gate driver circuitry 18 may be formed on a display substrate (e.g., on the left and right edges of display 14, on only a single edge of display 14, or elsewhere in display 14). Demultiplexer circuitry 20 may be used to demultiplex data signals from display driver integrated circuit 16 onto a plurality of corresponding data lines D. With this illustrative arrangement of FIG. 1, data lines D run vertically through display 14. Each data line D is associated with a respective column of display pixels 22. Gate lines G run horizontally through display 14. Each gate line G is associated with a respective row of display pixels 22. Gate driver circuitry 18 may be located on the left side of display 14, on the right side of display 14, or on both the right and left sides of display 14, as shown in FIG. 2.

Gate driver circuitry 18 may assert gate signals (sometimes referred to as scan signals or transistor control signals) on the gate lines G in display 14. For example, gate driver circuitry 18 may receive clock signals and other control signals from display driver integrated circuit 16 and may, in response to the received signals, assert a gate signal on gate lines G in sequence, starting with the gate line signal G in the first row of display pixels 22. As each gate line is asserted, the corresponding display pixels in the row in which the gate line is asserted will display the display data appearing on the data lines D. In display configurations with multiple scan lines per row, the control signals on the scan lines can be coordinated so that the transistors and other circuitry in the pixel circuit of the display pixels being controlled by the scan lines can perform threshold voltage compensation functions and other functions associated with operating display pixels 22. Other global and/or local control signals may be supplied to display pixels 22, if desired.

Figure 3:
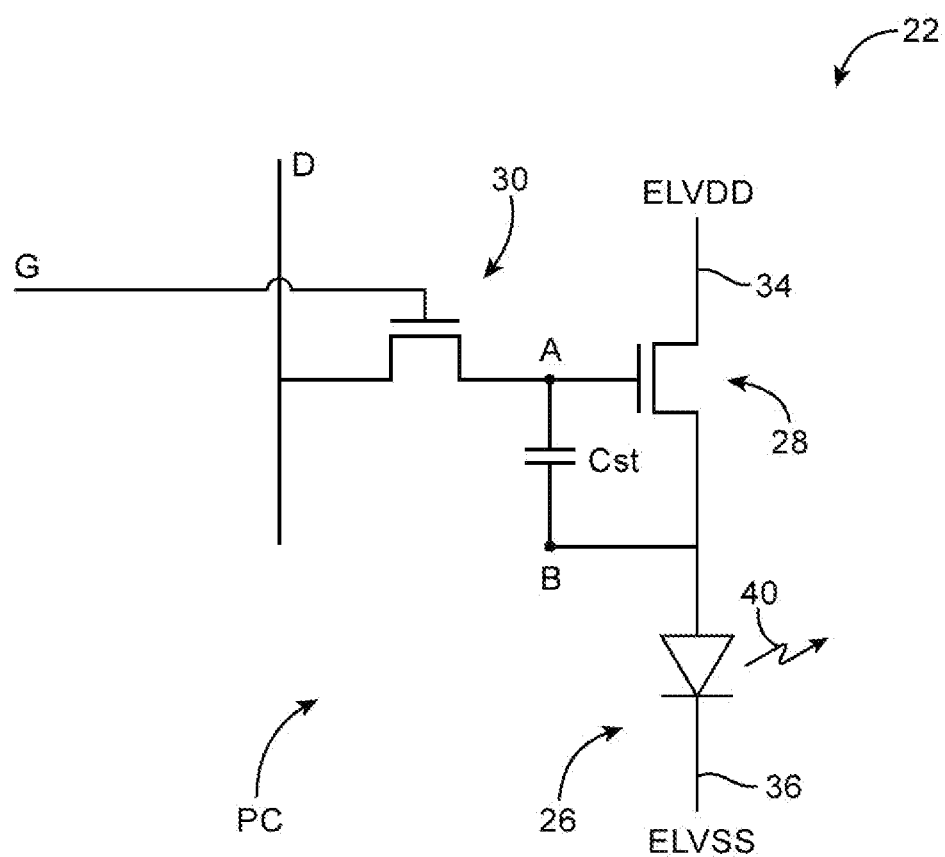
FIG. 3 is a diagram of an illustrative organic light-emitting diode display pixel in accordance with an embodiment.

Each display pixel 22 in display 14 contains a respective organic light-emitting diode. A schematic diagram of an illustrative organic light-emitting diode display pixel 22 is shown in FIG. 3. As shown in FIG. 3, display pixel 22 may include light-emitting diode 26 controlled by a thin-film transistor-based pixel circuit PC. A positive power supply voltage ELVDD may be supplied to positive power supply terminal 34 and a ground power supply voltage ELVSS may be supplied to ground power supply terminal 36. Diode 26 may have an anode coupled to drive transistor 28 and a cathode coupled to ground power supply terminal 36. The state of drive transistor 28 in pixel circuit PC controls the amount of current flowing through diode 26 and therefore the amount of emitted light 40 from display pixel 22.

To ensure that transistor 28 is held in a desired state between successive frames of data, display pixel 22 may include a storage capacitor such as storage capacitor Cst. The voltage on storage capacitor Cst is applied to the gate of transistor 28 at node A to control transistor 28. Data can be loaded into storage capacitor Cst using one or more switching transistors such as switching transistor 30. When switching transistor 30 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 30 will be turned on and a new data signal on data line D will be loaded into storage capacitor Cst. The new signal on capacitor Cst is applied to the gate of transistor 28 at node A, thereby adjusting the state of transistor 28 and adjusting the corresponding amount of light 40 that is emitted by light-emitting diode 26.

If desired, display pixel circuits for display pixels 22 of display 14 may be implemented using different numbers of switching transistors, different numbers of storage capacitors, different numbers of control lines, and other different types of display pixel circuit architectures. The circuitry of illustrative display pixel circuit PC of display pixel 22 in FIG. 3 is merely an example.

Figure 4:
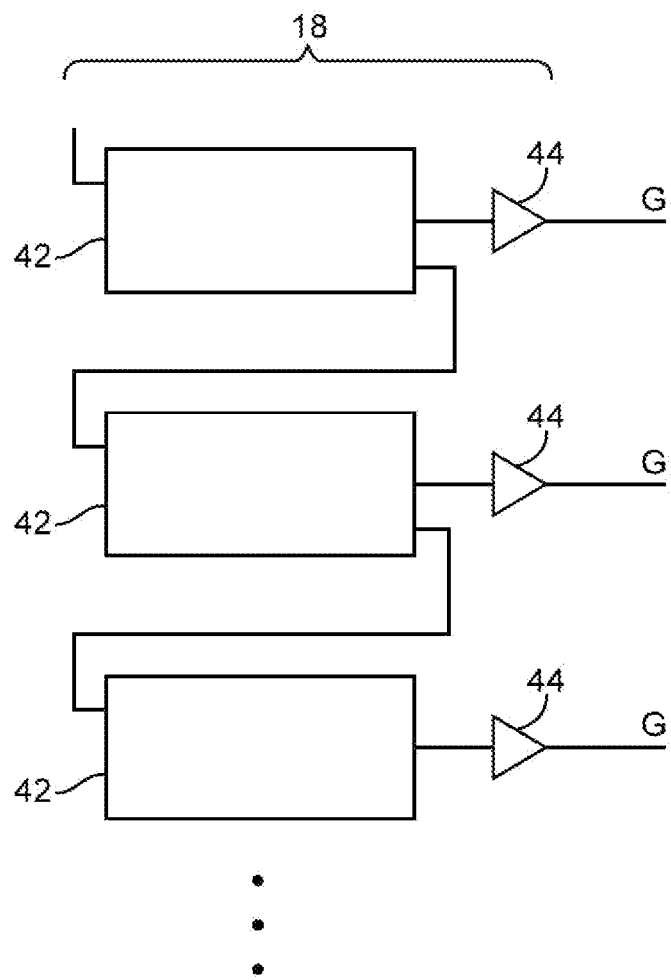
FIG. 4 is a circuit diagram of illustrative gate driver circuitry for a display in accordance with an embodiment.

Illustrative gate driver circuitry 18 for display 14 is shown in FIG. 4. As shown in FIG. 4, gate driver circuitry 18 may include a chain of shift register circuits 42. At the output of each shift register circuit, a respective gate line buffer 44 may be used to drive a corresponding gate line signal (scan line signal) onto a corresponding gate line G. In displays having multiple scan lines per row of display pixels 22, there may be multiple gate lines (scan lines) G and corresponding buffers 44 at the output of each shift register circuitry in each row. The example of FIG. 4 is merely illustrative.

Figure 5:
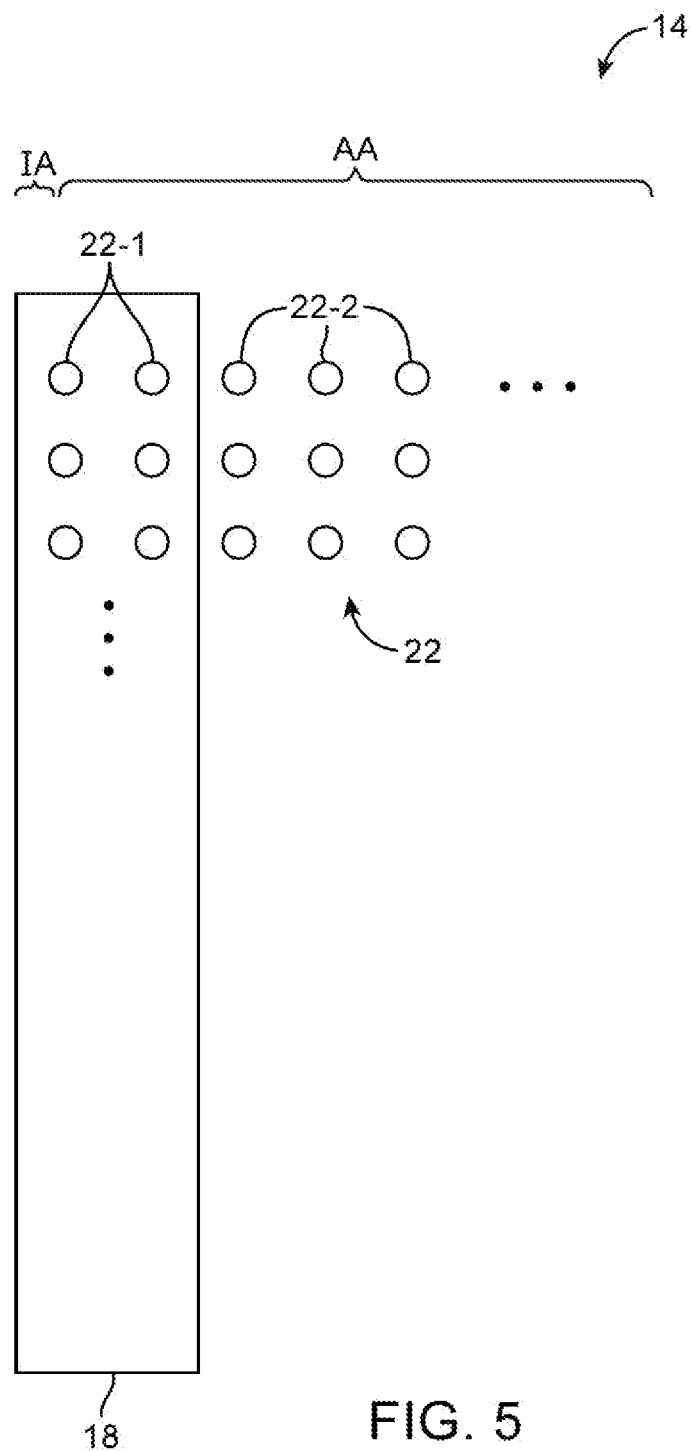
FIG. 5 is a diagram of an illustrative organic light-emitting diode display having display pixel structures that overlap gate driver circuitry to minimize inactive display borders in accordance with an embodiment.

To minimize the sizes of the left and right borders of display 14, some of structures in display pixels 22 of active area AA may overlap gate driver circuitry 18. As shown in FIG. 5, for example, gate driver circuitry 18 may be arranged along the left edge of display 14 (as an example). Gate driver circuitry 18 of FIG. 5 may contain shift register circuits 42 and buffers 44 of the type shown in FIG. 4. Active area AA of display 14 may include an array of display pixels 22. Display pixels 22 may be organized in a rectangular array having rows and columns. Some display pixel structures such as the anodes and pixel circuits in display pixels 22-2 may lie in the center of display 14 and may not overlap any of gate driver circuitry 18. Other display pixel structures such as the anodes of display pixels 22-1 may fully or partly overlap gate driver circuitry 18. Because the anodes of display pixels 22-1 form part of light-emitting diodes 26 for display pixels 22-1, the anodes of display pixels 22-1 that overlap gate driver circuitry 18 can emit light for forming part of an image. There may therefore be little or no inactive area IA along the left (or right) edges of display 14.

Figure 6:
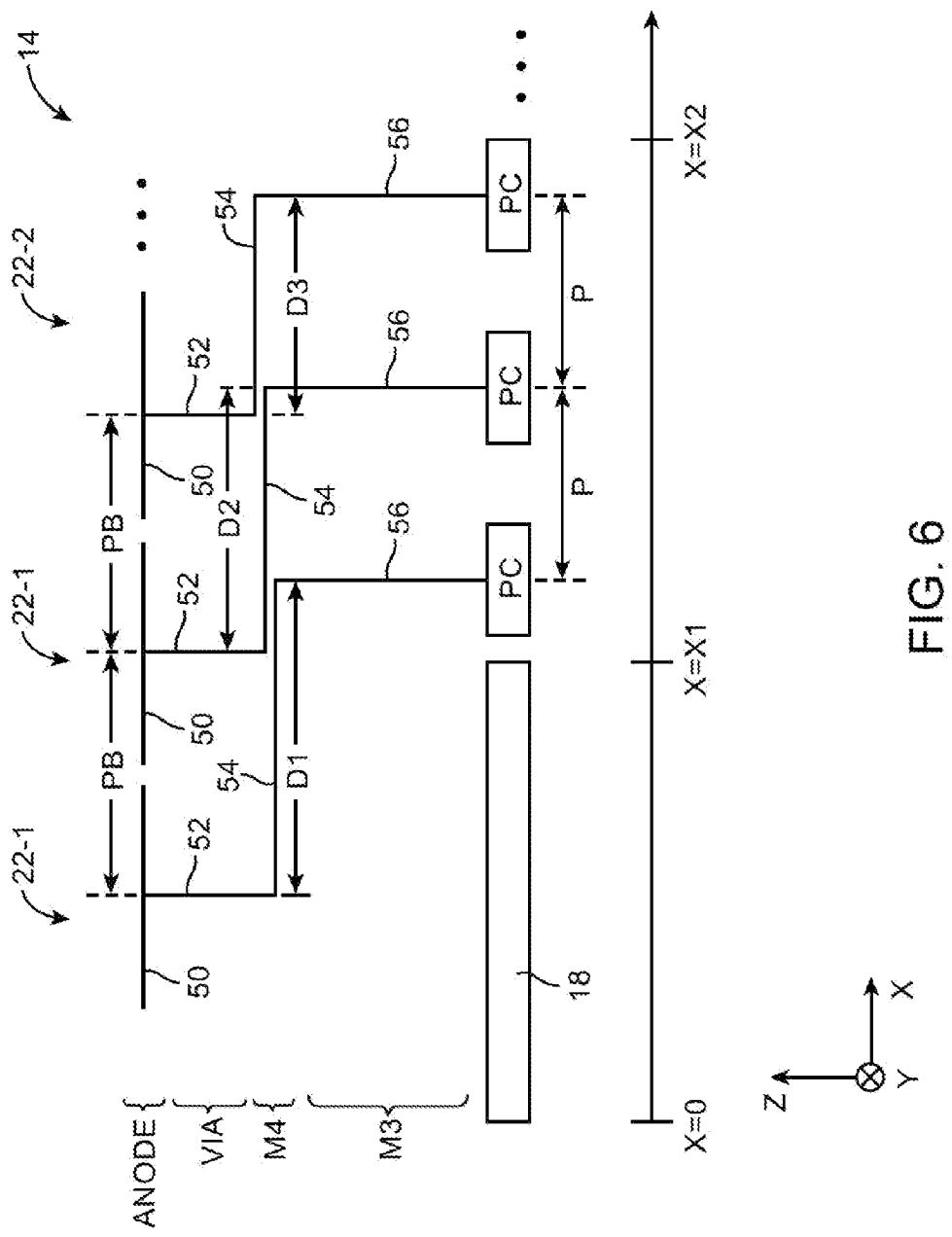
FIG. 6 is a cross-sectional side view of an illustrative display showing how display pixel anodes may overlap gate driver circuitry in accordance with an embodiment.

FIG. 6 is a cross-sectional side view of display 14 showing illustrative layers of metal and metal via structures that may be used in forming a display having a layout of the type shown in FIG. 5. As shown in FIG. 6, a portion of display (e.g., the portion extending from X=0 to X=X1 in FIG. 6) may contain gate driver circuitry 18. Another portion of the display (e.g., the portion extending from X=X1 to X=X2) may contain display pixel circuits PC. Display pixel circuits PC may contain thin-film transistors, capacitor structures for storage capacitor Cst, and other circuitry for display pixels 22 (see, e.g., display pixel circuit PC of FIG. 3). Pixel circuits PC may be coupled to respective light-emitting diodes 26. Each light-emitting diode may have a respective anode 50. A shared cathode may be used for the light-emitting diodes of display 14. Light 40 (FIG. 3) is emitted by emissive material that is sandwiched between anodes 50 and the cathode.

Anodes 50 that are near the edge of display 14 (i.e., anodes running along the left and/or right edge of display 14 that are associated with display pixels 22-1) overlap gate driver circuitry 18. Anodes 50 that are located nearer the center of display 14 (i.e., anodes associated with display pixels 22-2 of FIG. 6) do not overlap any of gate driver circuitry 18, but rather only overlap pixel circuits PC.

As shown in FIG. 6, display 14 may be formed from patterned metal and vias layers. In addition to the layers used in forming gate driver circuitry 18 and pixel circuits PC (e.g., metal layers such as a first metal layer M1 that forms thin-film transistor gates and a second metal layer M2 that forms thin-film transistor source-drain electrodes), these layers of display 14 may include a third metal layer M3 for forming conductive paths 56, a fourth metal layer M4 for forming conductive paths 54, a via layer VIA for forming vias 52, and a metal layer for forming anodes 50. Paths 56 are used to couple pixel circuits PC to respective horizontal lines 54. Vias 52 are used in coupling respective anodes 50 to lines 54.

Pixel circuits PC may be arranged in a rectangular area in the center of display 14 and may be flanked by gate driver circuits 18 on opposing edges of display 14. The spacing between pixel circuits PC is preferably constant (fixed) across the surface of display 14. As shown in FIG. 6, for example, pixel circuits PC may have a fixed pitch (pixel-circuit-to-pixel-circuit spacing) of P. Anodes 50 likewise have a fixed pitch (anode-to-anode spacing) as shown by fixed anode separation PB. Anodes 50 are spread out across the entire width (or nearly the entire width) of display 14 to minimize inactive border IA, whereas pixel circuits PC are inset slightly from the edges of display 14 to accommodate gate driver circuitry 18 along the left and right edges of the display substrate. Anode pitch PB is therefore greater than pixel circuit pitch P.

Because anodes 50 are spaced apart by a value PB that is greater than the spacing P between pixel circuits PC, the lengths of horizontal lines 54 in metal layer M4 vary across as a function of lateral distance X across the width of display 14. As shown in FIG. 6, for example, the leftmost line segment 54 has a length D1, the next-to-leftmost line segment 54 has a length D2 that is less than D1, and successive line segments 54 have progressively decreasing lengths at locations approaching the center of display 14 (see, e.g., line segment length D3, which is less than line segment length D2). By continuously varying the lengths of the horizontal connecting lines between pixel circuits PC and respective anodes 50, an array of pixel circuits PC in the center of display 14 that have a smaller pitch P can be coupled to an array of anodes 50 that cover the entire display 14 with a larger pitch PB. There may be a small inactive peripheral area IA of gate driver circuitry 18 that is not covered by display pixel anodes 50 or all of gate driver circuitry 18 may be covered with display pixel anodes 50. In either case, inactive border width W1 is minimized due to the overlap of anodes 50 and gate driver circuitry 18.

Figure 7:
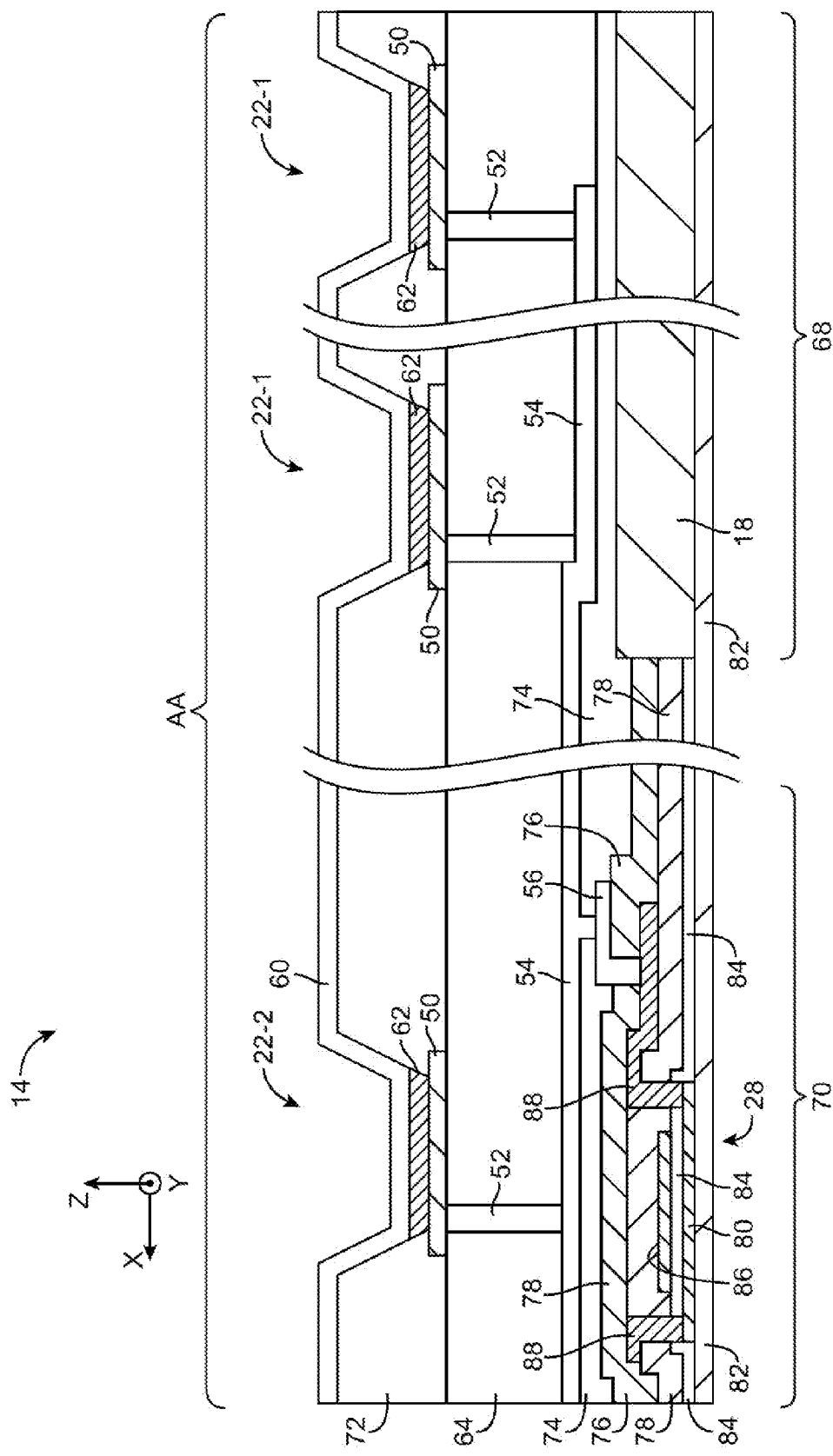
FIG. 7 is a cross-sectional side view of an illustrative display showing how illustrative thin-film transistor circuitry and display pixel circuitry that may be used in a display in which display pixel anodes overlap gate driver circuitry in accordance with an embodiment.

FIG. 7 is a cross-sectional side view of illustrative structures that may be used in forming a display with gate driver circuitry that is overlapped by anodes 50 of active area AA. The right edge portion of display 14 is shown in FIG. 7. The left edge of display 14 may be formed using the same structures.

As shown in FIG. 7, display pixels 22-1 and 22-2 may have respective anodes 50 each of which is overlapped by a respective emissive layer structure 62. Each display pixel may include a portion of a shared cathode (layer 60) and a respective anode 50. The emissive material 62 of each display pixel emits light when current is passed between cathode 60 and the anode 50 in that display pixel. Display pixels 22-2 have anodes 50 that do not overlap gate driver circuitry 18. Display pixels 22-1 are formed from anodes 50 that overlap gate driver circuitry 18.

Vias 52 may be formed from a metal or other conductive material that passes through dielectric layer 64. Dielectric layer 64 may be an organic planarization layer (e.g., a polymer layer). Pixel definition layer 66 may define the positions of emissive material areas 62 and may be formed from a dielectric such as polyimide or other polymer. Cathode layer 60 may be formed from a conductive layer such as a layer of transparent conductive material (e.g., indium tin oxide and a thin layer of metal such as a 100 angstrom silver layer).

A metal layer (e.g., a fourth metal layer) may be used to form lines 54, as described in connection with FIG. 6. The metal layer for forming paths 54 may be formed on top of passivation layers 74 and 76 (e.g., layers of silicon oxide and/or silicon nitride). Interlayer dielectric layers (e.g., silicon oxide and/or nitride layers) such as layer 78 may be formed under passivation layer 76.

Gate driver circuitry 18 may be formed from thin-film transistor circuitry on substrate 82. Pixel circuits PC (see, e.g., circuitry 70) may be also be formed on substrate 82. Pixel circuits PC may include transistors such as thin-film transistor 28. Transistor 28 may be a drive transistor for driving a light-emitting diode 26 that is formed from a respective anode 50, emissive layer 62, and portion of cathode 60). As shown in FIG. 7, transistor 28 includes a semiconducting channel formed from semiconductor layer 80. Layers such as layer 80 may be formed from silicon (e.g., polysilicon), may be formed from a semiconducting oxide such as indium gallium zinc oxide, or may be formed from other semiconductors.

Layer 80 and the other thin-film transistor circuitry of FIG. 7 may be formed on substrate 82. Substrate 82 may include one or more layers of glass, polymer (e.g., polyimide), metal, ceramic, or other materials.

Gate insulator layer 84 may be formed from silicon oxide or other dielectric material and may cover semiconductor channel layers such as channel layer 86 in thin-film transistors such as transistor 28. A patterned metal layer (e.g., a second metal layer sometimes referred to as M2 or a source-drain metal layer) may be used in forming source-drain electrodes 88 for transistors such as transistor 28. Each thin-film transistor may have a gate electrode such as gate electrode 86 of transistor 28. Gate electrode 86 may be formed from metal (e.g., a first metal layer) on gate insulator layer 84. As shown in FIG. 7, each gate 86 overlaps a respective channel region 80 and lies between respective source-drain electrodes 88. During operation, the drive transistor 28 of each pixel circuit PC supplies drive current to a corresponding anode 50 and the associated light-emitting diode 26 that is formed from that anode. This causes the display pixel 22 that includes that light-emitting diode to emit light 40 (FIG. 3). Paths such as horizontal paths 54 may be used to distribute the drive current from thin-film transistors such as transistor 28 of FIG. 7 to associated anodes 50 (e.g., anodes 50 overlapping display driver circuitry 18 and anodes 50 that overlap pixel circuits PC).

Figure 8:
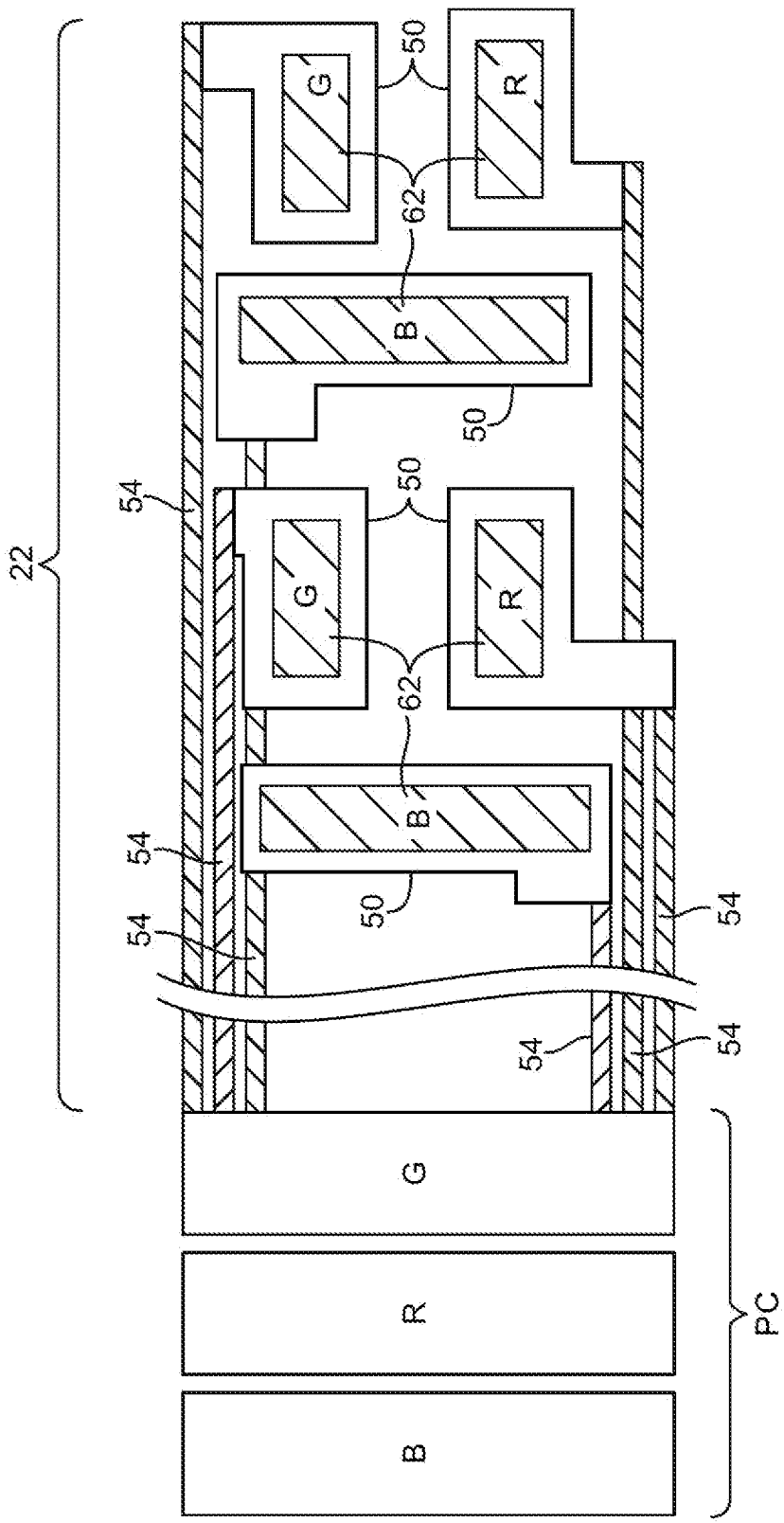
FIG. 8 is a top view of an illustrative display showing how illustrative thin-film transistor circuitry and display pixel circuitry that may be used in a display in which display pixel anodes overlap gate driver circuitry in accordance with an embodiment.

FIG. 8 is a top view of an illustrative scheme in which pixel circuits PC have been laterally interconnected with display pixels using horizontal paths 54. Pixels 22 may include sub-pixels with differently colored emissive layers 64 (e.g., red layers R, blue layers B, and green layers G). Layers 64 may overlap respective anodes 50. The anodes 50 of pixels 22 may be laterally spaced from the pixel circuits PC that are controlling pixels 22 (e.g., to allow some anodes 50 to be stacked above gate driver circuitry 18). Horizontal paths 54 may convey signals between pixel circuits PC (e.g., pixel circuits for respectively controlling blue, red, and green subpixels) and associated anodes 50 in display pixels 22.

The foregoing is merely illustrative and various modifications can be made by those skilled in the art without departing from the scope and spirit of the described embodiments. The foregoing embodiments may be implemented individually or in any combination.

What is claimed is:

1. An organic light-emitting diode display, comprising:
    a substrate;
    pixel circuits on the substrate;
    gate driver circuitry along at least one edge of the substrate;
    an array of display pixels, wherein the display pixels include anodes that overlap the gate driver circuitry and anodes that overlap the pixel circuits; and
    a shared cathode layer that overlaps all of the anodes.

2. The organic light-emitting diode display defined in claim 1 further comprising emissive material between the shared cathode layer and each anode.

3. The organic light-emitting diode display defined in claim 2 wherein the pixel circuits have a pixel-circuit-to-pixel-circuit spacing and wherein the anodes have an anode-to-anode spacing that is larger than the pixel-circuit-to-pixel-circuit spacing.

4. The organic light-emitting diode display defined in claim 3 further comprising horizontal lines that couple some of the pixel circuits to the anodes that overlap the gate driver circuitry.

5. The organic light-emitting diode display defined in claim 4 further comprising a first metal layer, a third metal layer, and a second metal layer between the first and third metal layers, wherein the horizontal lines are formed from the third metal layer.

6. The organic light-emitting diode display defined in claim 4 wherein the gate driver circuitry includes shift register circuits.

7. The organic light-emitting diode display defined in claim 6 further comprising an organic planarization layer interposed between the gate driver circuitry and the anodes that overlap the gate driver circuitry.

8. The organic light-emitting diode display defined in claim 1 wherein the pixel circuits and gate driver circuitry include thin-film transistors formed from a semiconductor layer selected from the group consisting of: a silicon layer and semiconducting oxide layer.

9. The organic light-emitting diode display defined in claim 8 wherein the thin-film transistors include gates that overlap the semiconductor layer.

10. The organic light-emitting diode display defined in claim 8 further comprising a first metal layer that forms the gates, a second metal layer that forms source-drain electrodes for the thin-film transistors, a fourth metal layer that forms lateral signal paths between the pixel circuits and the anodes that overlap the gate driver circuitry, and a third metal layer between the second metal layer and the fourth metal layer.

11. The organic light-emitting diode display defined in claim 1 further comprising horizontal metal lines that couple the pixel circuits to the anodes that overlap the gate driver circuitry.

12. The organic light-emitting diode display defined in claim 11 wherein the gate driver circuitry includes shift register circuitry and buffer circuits.

13. The organic light-emitting diode display defined in claim 12 further comprising data lines and gate lines, wherein each buffer circuit provides a signal to a respective one of the gate lines.

14. An organic light-emitting diode display, comprising:
    a rectangular substrate having four edges including left and right edges;
    a left-hand gate driver circuit located along the left edge;
    a right-hand gate driver circuit located along the right edge;
    an array of display pixels each having a light-emitting diode with an anode and a cathode and each having a pixel circuit that controls current through the light-emitting diode of that display pixel, wherein some of the anodes are between the left-hand gate driver circuit and the right-hand gate driver circuit overlapping the pixel circuits, wherein some of the anodes overlap the left-hand gate driver circuit, and wherein some of the anodes overlap the right-hand gate driver circuit; and horizontal metal lines that couple the pixel circuits to the anodes that overlap at least one of the left-hand gate driver circuit and the right-hand gate driver circuit.

15. The organic light-emitting diode display defined in claim 14 wherein the left-hand gate driver circuit and the right-hand gate driver circuit include shift register circuits and buffers.

16. The organic light-emitting diode display defined in claim 15 wherein the buffersprovide control signals to horizontal gate lines extending across the rectangular substrate between the left to the right edges.

17. The organic light-emitting diode display defined in claim 16 further comprising emissive material on each anode, wherein the cathodes are formed from a shared cathode layer that overlaps the anodes that overlap the left-hand gate driver circuit, the anodes that overlap the right-hand gate driver circuit, and the anodes overlapping the pixel circuits between the left-hand gate driver circuit and the right-hand gate driver circuit.

18. An organic light-emitting diode display, comprising:
gate driver circuitry formed from a chain of shift register circuits; and
an array of display pixels to display images, wherein each display pixel includes a light-emitting diode having a cathode, an anode, and emissive material that emits light, wherein each display pixel receives a signal from the gate driver circuitry, wherein some of the anodes overlap the chain of shift register circuits, and wherein the emissive material is on each of the anodes.

19. The organic light-emitting diode display defined in claim 18 wherein each of the display pixels has a pixel circuit that controls emission of the light from the light-emitting diode of that display pixel, wherein some of the anodes overlap the pixel circuits, wherein the pixel circuits are located between a first portion of the gate driver circuitry on a first edge of the display and a second portion of the gate driver circuitry on an opposing second edge of the display, and wherein the pixel circuit of each display pixel includes a thin-film drive transistor having a source-drain terminal coupled to the anode of the light-emitting diode for that display pixel.

* * * * *